United States Patent
Fujii et al.

(10) Patent No.: US 6,320,296 B1
(45) Date of Patent: Nov. 20, 2001

(54) DIAMOND WAFER, METHOD OF ESTIMATING A DIAMOND WAFER AND DIAMOND SURFACE ACOUSTIC WAVE DEVICE

(75) Inventors: Satoshi Fujii; Yuichiro Seki; Kentaro Yoshida; Hideaki Nakahata; Kenjiro Higaki; Hiroyuki Kitabayashi; Tomoki Uemura; Shin-ichi Shikata, all of Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/825,887

(22) Filed: Apr. 5, 2001

Related U.S. Application Data

(62) Division of application No. 09/166,840, filed on Oct. 6, 1998, now Pat. No. 6,210,780.

(30) Foreign Application Priority Data

Oct. 6, 1997 (JP) .................................................. 9-290262

(51) Int. Cl.$^7$ .................................................. H10L 41/08
(52) U.S. Cl. ..................... 310/313 A; 310/313 R
(58) Field of Search ............................ 310/313 R, 313 A

(56) References Cited

U.S. PATENT DOCUMENTS

| 3,767,306 | 10/1973 | Mast et al. . |
| 4,664,514 | 5/1987 | Corby, Jr. . |
| 5,402,029 | * 3/1995 | Nakamura et al. ............... 310/313 R |
| 5,565,724 | * 10/1996 | Hachigo et al. .................. 310/313 A |
| 5,576,589 | * 11/1996 | Dreifus et al. ................... 310/313 A |
| 5,646,468 | * 7/1997 | Nakahata et al. ................ 310/313 A |

OTHER PUBLICATIONS

Gahlin, et al, The Effects of Compressive Stresses on the Abrasion of Diamond Coatings, Elsevier Science S.A., 1996, pp. 226–233.

Choi, et al, "Surface Characterization of Diamond Films Polished by Thermomechanical Polishing Method", Elsevier Science S.A., 1996, pp. 110–114.

Fujii S. et al., "Diamond Wafer for Saw Application," IEEE Ultrasonics Symposium Proceedings, U.S., New York, NY: IEEE, Oct. 5, 1997, pp. 183–186, XP000848471 ISBN: 0-7803-4154-6, co. 2, par. 2—col. 3, par. 1.

EPO Search Report for EP 98308109.2 dated Sep. 5, 2000.

* cited by examiner

Primary Examiner—Archene Turner

(57) ABSTRACT

Surfaces of diamond crystals are examined by coating the surfaces with thin metal films, launching laser beams to the diamond surfaces in a slanting angle, detecting defects and particles on the diamond surfaces by the scattering of beams and counting the defects and particles by a laser scanning surface defect detection apparatus. Diamond SAW devices should be made on the diamond films or bulks with the defect density less than 300 particles cm$^{-2}$. Preferably, the diamond surfaces should have roughness less than Ra20 nm. Diamond SAW filters can be produced by depositing a piezoelectric film and making interdigital transducers on the low-defect density diamond crystals.

2 Claims, 6 Drawing Sheets

Formation of electrodes by photolithography

Fig. 1
$Ra \leq 10 nm$
Defect density $\leq 300/cm^2$
| Carbon layer | $d \leq 10 nm$ |
| Diamond | $S \geq 19 cm^2$ $P \leq 1.5 \times 10^8 Pa$ |
Fig. 2
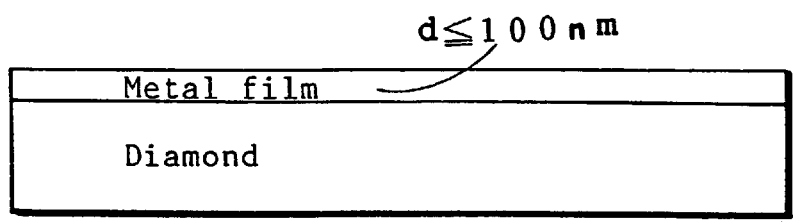
Fig. 3 (a)
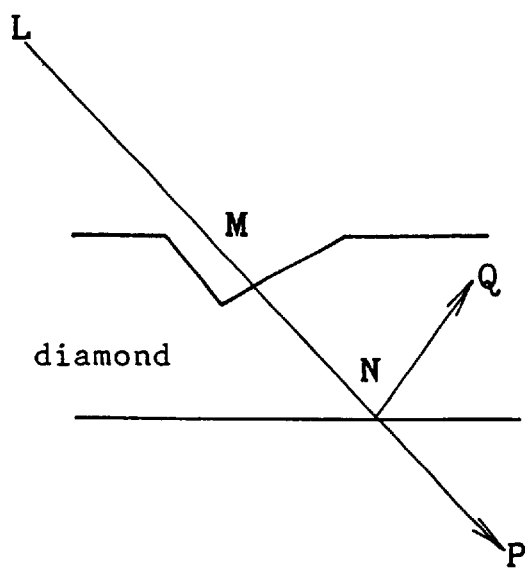
Fig. 3 (b)
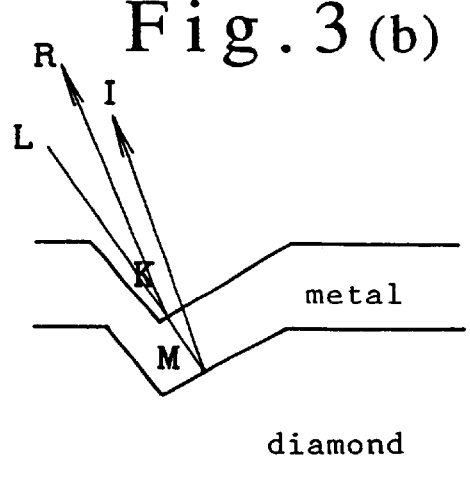

Laser scanning surface defect detection apparatus

Synthesis of diamond by microwave plasma CVD

Flattening of diamond surface by polishing

Formation of ZnO film by sputtering

Deposition of Al film by sputtering

Formation of electrodes by photolithography

DIAMOND WAFER, METHOD OF ESTIMATING A DIAMOND WAFER AND DIAMOND SURFACE ACOUSTIC WAVE DEVICE

This application is a division of Application Ser. No. 09/166,840, filed Oct. 6, 1998, now U.S. Pat. No. 6,210,780.

BACKGROUND OF THE INVENTION

1. Field of the Invention

This invention relates generally to a diamond wafer and a surface acoustic wave (SAW) device produced on the diamond wafer. This invention relates more specially to a method of estimating diamond wafers which judges whether a diamond wafer is suitable for producing SAW devices or not. The estimation selects diamond wafers that have a low density of surface defects which enables manufacturers to produce a low loss SAW device. The diamond wafers can also be used as the substrates of microelectronic devices with microscopic wiring or the substrates of micromachines with microscopic structures.

This application claims the priority of Japanese Patent Application No.9-290262 (290262/97) filed Oct. 6, 1997 which is incorporated herein by reference.

2. Description of Related Art

Diamond enjoys the highest sound velocity among all the natural materials. The hardness is also the highest. The thermal conductivity is large. The band gap of diamond is 5.5 eV which is an extremely high value among all known materials. Diamond is excellent in dynamical property, electrical property and electronic property. Diamond is used for dynamic devices and electronic devices that can take advantage of its excellent properties.

Improvements have been made by taking advantage of the outstanding properties of diamond in the technical fields of acoustics, optics and semiconductor. Exploitation of diamond will be effective for improving various properties of electronic, acoustic devices or for enlarging margins of operation of the devices.

A surface acoustic wave device (SAW device) is a good candidate for the use of diamond for improving its characteristics. Surface acoustic wave devices can be configured to be, for example, a radio frequency filter, a phase shifter, a convolver, an amplifier, etc. The SAW filter acts as an IF (intermediate frequency) filter of television sets or various filters of communication devices. A surface acoustic wave device is a device having a rigid base, a piezoelectric film stuck to the rigid base and interdigital transducers formed on both ends of the piezoelectric film. Application of an AC voltage on the interdigital transducer causes an AC electric field on the piezoelectric film which deforms in proportion to the electric field. Since the electric field oscillates, the piezoelectric film alternatively expands and contracts in the horizontal direction between two interdigital transducers at the same frequency as the AC voltage.

The piezoelectric film oscillates in the horizontal direction with the frequency of the AC signal. Since the piezoelectric film adheres to the rigid base, the rigid base also oscillates at the same frequency in the same manner. Since the rigid base repeats expansion and contraction at the interdigital transducer (IDT), the oscillation propagates as a longitudinal elastic wave on the surface. The AC voltage applied on the interdigital transducer generates an elastic wave. The wavelength is determined by the period of the interdigital transducer. The elastic wave spreads from one interdigital transducer to the other interdigital transducer. The piezoelectricity is reversible. At the receiving interdigital transducer, the deformation oscillation induces an AC voltage between the components of the electrode. As a whole, the AC signal propagates from one interdigital transducer to the other interdigital transducer by the elastic wave. The wave is called surface acoustic wave (SAW), because it propagates on the surface of the device.

The period of the interdigital transducer uniquely determines the wavelength $\lambda$ of the surface acoustic wave. The rigidity and density of the rigid base determine the velocity v of the SAW. The more rigid and lighter base brings about the higher SAW velocity. SAW velocity v is different from sound velocity which is equal to a square root of Young's modulus E divided by density $\rho$. As with sound velocity, the SAW velocity is higher for the rigid base of higher Young's modulus and lower density. A sound wave is an elastic wave passing through an inner portion of a material. SAW is another elastic wave propagating only on the surface of the material. SAW differs from sound wave. SAW velocity is, in general, higher than sound velocity.

Since the wavelength $\lambda$ and the velocity v have been predetermined by the interdigital transducer and the physical property of the rigid base, the frequency f is also surely determined as $f=v/\lambda$. This is a unique value. Since f is a unique value, it is denoted by $f_0$. Namely, the SAW device has a filtering function which selectively allows only the SAW of $f_0$ to pass the device. SAWs of frequency different from $f_0$ attenuate. Transmittable SAW has a definite frequency $f_0$ which is determined by the material of the rigid base and the spatial period of the interdigital transducers. SAW devices have been applied to TV filters having a low allowable frequency of several megahertzs to tens of megahertzs. Hopefully, SAW devices will be applied to far higher frequency filters, for instance, optical communication filters of 2.488 GHz or wireless LAN filters in near future.

Raising frequency $f_0$ requires either narrowing a spatial period of interdigital transducers or increasing a SAW velocity v. The spatial period of interdigital transducers is limited by the current lithography technology. The only way is the increase of velocity v. Diamond, as a rigid base, exhibits the highest SAW velocity among all natural materials. The application of diamond to SAW devices attracts attention. Diamond endows the SAW devices with the highest velocity which affords a moderately wide spatial period to the interdigital transducers.

High velocity is not the only requisites for a material used for SAW devices. Low propagation loss is another important requirement for SAW materials. Loss is a key concept of the present invention. There are different losses in addition to the propagation loss. Losses are now briefly clarified. One is the Joule loss $\Delta Er$ by the resistance of the interdigital transducers to which electric power is supplied. Another is an electromechanical conversion loss $\Delta Ec$ of energy accompanying the expansion and contraction of the piezoelectric material by the AC electric field. The loss depends on the electromechanical coefficient of the piezoelectric film. The interdigital transducer which converts electric power into mechanical power through the piezoelectric film has no selectivity of direction. The surface acoustic waves propagate in both directions perpendicular to the stripes of the interdigital transducers. Just half of the mechanical power spreads toward the counterpart interdigital transducer. Another half (6 dB) is a loss. This is called a bisection loss $\Delta Eb$. Now a SAW starts from one interdigital transducer and some of the SAW arrives at the other interdigital transducer. The difference between the starting SAW power and arriving SAW power is the propagation loss ΔEp. The aim of the present invention is a reduction of the propagation loss ΔEp. At the other interdigital transducer, the piezoelectric film converts the mechanical power of SAW into electric power of AC voltage with a conversion loss ΔEc. The current flows in the receiving interdigital transducer with a resistance loss ΔEr.

Total loss is a sum, 2ΔEr+2ΔEc+ΔEb+ΔEp, of the resistance loss 2ΔEr, the conversion loss 2ΔEc, the bisection loss ΔEb and the propagation loss ΔEp. ΔEr is contingent upon interdigital transducers. ΔEc is ruled by the piezoelectric material. Geometry decides ΔEb. Only the propagation loss ΔEp depends upon the insulating material (rigid base). This invention aims at alleviating ΔEp.

The insulator which has been most widely used as the material of the rigid base is glass. Glass is an inexpensive and low-loss insulator. ZnO/glass SAW filters have been popularly employed as TV intermediate frequency filters. Zinc oxide (ZnO) is a piezoelectric material. ZnO/glass means a SAW filter having a glass substrate and a ZnO film deposited on the glass. In spite of low-loss and low-cost, glass SAW devices cannot raise operation frequency $f_0$ owing to the low SAW velocity v. Somebody has proposed new SAW devices having a harder rigid base than glass, for example, sapphire, quartz, LiNbO$_3$ and so on. These new materials give higher SAW velocity than glass owing to high Young's modulus. However, the SAW velocities of sapphire SAW devices, quartz SAW devices or LiNbO$_3$ SAW devices are still unsatisfactory for high frequency filters. Diamond is the most promising candidate which gives the highest SAW velocity due to the extreme rigidity.

Diamond SAW devices enable the current lithography technology to pattern interdigital transducers for a frequency higher than 1 GHz owing to the high SAW velocity v. However, the propagation loss ΔEp is still large in diamond SAW devices. The large propagation loss ΔEp leaves diamond SAW devices impractical. It is difficult to make a wide, flat, even, smooth and defect-free diamond film covering the whole of the device due to the extreme rigidity of diamond. It is further difficult to make a flat piezoelectric film on the defect-rich diamond film. Even if the piezoelectric film is produced, it is still a piezoelectric film of poor quality. Many defects on the diamond surface and the shortness of the SAW wavelength raise the propagation loss ΔEp and leave diamond SAW devices inoperative.

Since the frequency f is very high, the wavelength λ=v/f is reduced to a similar size to the micro-cavities and micro-convexities. Acoustic phonons building the surface acoustics wave are scattered by the micro-defects, because phonons are mostly perturbed by the objects of the same size as the wavelength. Besides the high propagation loss ΔEp, the defects-rich diamond film decreases the yield of SAW devices by raising the rate of electrode-pattern cutting. Micro-defects prevent diamond SAW device from growing to practical SAW devices through the large propagation loss ΔEp and the low yield. Here "yield" means a ratio of the number of good products to the number of all products.

One purpose of the present invention is to produce diamond SAW devices having low propagation loss. Another purpose of the present invention is to enhance the yield of the diamond SAW devices. In addition to SAW devices, this invention can be applied to raising the yield of the production of microelectronic devices or micromachines making use of small wire patterns with a breadth less than 5.0 μm through reducing the rate of the wiring pattern cutting.

Higher frequency requires SAW filters to make a still better piezoelectric film. The undercoating diamond film must be flat, smooth and defect-free for producing (Diamond)/(piezoelectric material) SAW devices. For this purpose, a simple and reliable estimation technique of diamond films is indispensable besides fabrication of good diamond films. This invention proposes also a method for easily estimating diamond films.

Diamond films have been examined by observing micro-defects, micro-concavities or micro-convexities by scanning electron microscopes or atomic force microscopes. ① R. Gahlin, A. Alahelisten, S. Jacobson, "The effects of compressive stresses on the abrasion of diamond coatings", Wear 196 (1996) 226–233 ② S. K. Choi, D. Y. Jung, S. Y. Kweon, S. K. Jung, "Surface characterization of diamond films polished by thermomechanical polishing method", Thin Solid Films 279 (1996) 110–114

Microscope estimation is a straight and reliable method, since diamond surface is directly observed by a microscope. However, the field of vision is too narrow. The observation field is, e.g., about 10 μm×10μm for a scanning electron microscope. In general, a SAW device has a size of about 100 μm×100 μm to 20000 μm×20000 μm. The area of a SAW device is far broader than the field of vision of microscopes. It would take very much time to observe the whole surface of a SAW device by microscopes. Microscope observation cannot be applied to the examination of diamond surfaces in the process of producing diamond SAW devices. Namely, there is no estimation method available for examining diamond surface on an industrial scale.

Producing diamond SAW devices requires a comprehensive estimation method of examining the entier diamond surface at a stretch If the diamond film can be easily examined, one can judge whether a piezoelectric film should be deposited on it or not. If the diamond film is bad, the sample should be abandoned without coating with a piezoelectric film. Another purpose of the present invention is to propose a method of estimating physical property (roughness, defects) of a diamond film.

The Inventors of the present invention tried to utilize a laser scanning surface defect detection apparatus for silicon wafers to examine diamond films of SAW devices. Diamond is different from silicon in many physical properties. A laser scanning surface defect detection apparatus for silicon wafers cannot be readily used for estimating a diamond. Indeed, a laser scanning surface defect detection apparatus has never been used to examine diamond films. FIG. 4 shows a schematic view of the laser scanning surface defect detection apparatus.

The apparatus has an integral sphere, a laser, a lens and a photomultiplier. The inner wall of the integral sphere is a mirror. The integral sphere has an opening at the bottom. The semiconductor laser (L) is mounted at a niche on a side of the integral sphere for emitting an inspecting light beam slantingly down. The semiconductor laser can be replaced by a gas laser, e.g. a He-Ne laser. The integral sphere has an outlet (U) on the other side for taking out a reflected beam. The inspection comprises the steps of mounting an object wafer on a stage, bringing the bottom opening of the integral sphere close to the wafer (KTW), irradiating a point (T) on the surface of the wafer by the laser beam (LT), and measuring the power of the reflected light (S). The incident beam angle is equal to the refection angle. The laser (L) and the outlet (U) are determined to be symmetric in the integral sphere. Then, ∠LTK=∠UTW. If the surface is flat, all the reflected beams go out through the side opening (U). The photomultiplier detects no light. When a defect or a piece of dust lies on the object point (T), a portion of the laser beams is scattered by the defect or dust. The scattering beams impinge upon other parts of the wall of the integral sphere. The photomultiplier senses the scattered beams. FIG. 13 shows a bit of dust lying on the surface of the wafer. Parallel laser beams are randomly reflected by the dust in the directions E, F, G, etc. Reflected beams do not exit through the outlet (U) but impinge upon the inner wall of the integrated sphere and are reflected to the photomultiplier. The photomultiplier measures the scattering light with high sensitivity. The photomultiplier detects the existence of a dust at the sampling point (T) by an increase of its photocurrent. The bigger the dust is, the stronger the scattering light becomes. The reflected light power is in proportion to the size of the dust. It is easy to understand the scattering of light by dust. However, the photomultiplier can also detect geometrical surface defects. FIG. 14 shows a notch, a surface defect, on the surface of the silicon wafer. Silicon has a high refractive index (n=3.5) and high absorption for the visible light emitted from the laser. The complex refractive index n+jk of silicon has a large real part n and a large imaginary part k for the visible light. Laser light is strongly reflected at the interface between air and silicon. The notch (M) scatters the beam in other directions (MH) than that of the outlet (U). The scattered beams are again reflected by the inner wall of the integral sphere and arrive at the photomultiplier for generating a photocurrent. The existence of dust or a defect on the object point of the silicon wafer can easily be detected by the random scattering of light beams.

Since a Si wafer is a wide disc, defects and dust of all the portions are inspected by moving the stage in the two-dimensional XY-plane with regard to the integral sphere. There are two modes of movement of the stage. One is an assembly of rotation and parallel displacement of the shaft. The sampling point (T) moves in a spiral. This mode is called a spiral mode. The other is an assembly of x-direction displacement and y-direction displacement of the wafer. This is called a scanning mode. The overall movement enables the apparatus to detect dust or defects on the whole surface of the silicon wafer.

In the silicon semiconductor industry it is well known to use a laser scanning surface defect detection apparatus. It takes only a short time to examine a pretty wide silicon wafer by the laser scanning surface defect detection apparatus. Unlike observation by a microscope, the apparatus can measure the number or the density of defects or dust quantitatively over a wide range. However, the laser scanning surface defect detection apparatus cannot be readily used to examine the surface of diamond.

Diamond is transparent for the visible light emitted by the laser unlike silicon. Namely, the complex refractive index n+jk has a vanishing imaginary part k=0. The real part n=2.4 is also lower than the real part of silicon. The reflection rate is r=(n−1)/(n+1) for the vertical incidence. Since n is small, the reflection rate is also small. Transparency allows the visible light to penetrate into the diamond crystal. Any notch (M) on diamond cannot reflect the laser light in FIG. 3(a). A visible light beam passes a diamond bulk crystal without loss along a light path LMP in FIG. 3(a). If a diamond film is formed on an opaque substrate of a foreign material, the light passes the transparent diamond and arrives at the interface between the diamond film and the substrate. The beam is reflected by the foreign material substrate along the light path LNQ in FIG. 3(a). Since diamond is transparent, the reflection occurs not on the diamond surface but on the interface between the diamond film and the substrate. For this reason, the laser scanning surface defect detection apparatus cannot be applied to the examination of the surface of diamond. The Inventors thought that the laser scanning surface defect detection apparatus is a promising candidate for an inspection apparatus for diamond despite the difficulty of transparency.

SUMMARY OF THE INVENTION

One purpose of the present invention is to provide an improvement of the laser scanning surface defect detection apparatus so that it would be suitable for examining surface defects of diamond. Another purpose of the present invention is to provide a diamond substrate which is suitable for use as the substrate of SAW devices by examining surface defects by the laser scanning surface defect detection apparatus. The further purpose of the present invention is to provide a method of selecting diamond substrates suitable to form a piezoelectric film thereupon.

This invention coats a diamond film or substrate with a thin metal or non-metal film having a high reflection rate for the laser light. The thin film enables the laser scanning surface defect detection apparatus to detect defects or dust on a surface of the diamond, since the thin film reflects the laser light. The thin film should be made from a metal or non-metal having a reflectance greater than 50%. The thickness of the coating film is less than 100 nm. The surface of the coating has the same convexities and concavities as the surface of the diamond, since the coating film is thin enough. The coating layer transcribes the diamond surface. If the diamond has a surface defect (M), the coating layer has a similar surface defect (K), as shown in FIG. 3(b). Most of the beams are reflected at the coating layer. The rest penetrating into the coating layer is also reflected at the interface between the coating layer and the diamond. The material of the coating layer is, e.g., aluminum (Al), gold (Au), silver (Ag), copper (Cu), nickel (Ni) or so. Thin film of the metal has a sufficient reflection rate to the laser light. If the diamond has defects or dust, the coating layer has similar anomalies due to the defects or dust at the same spots. The formal anomalies reflect the laser beams at random. Then the laser beams are scattered indirectly by the defects or dust on the diamond. The coating layer enables a conventional laser scanning surface defect detection apparatus to detect defects or dust on an object diamond. Thus, the laser scanning surface defect detection apparatus can now be used for the estimation of diamond surfaces.

FIG. 2 shows a diamond Wystal covered by a metal coating layer. The coated diamond is examined with regard to defects or dust by the laser scanning surface defect detection apparatus. If dust lies on the surface, the dust itself scatters the laser light. The scattered light arrives at the photomultiplier. The existence of the dust can be surely detected by the apparatus. However, defect detection is a problem. As shown in FIG. 3(b), the metal coating layer has the same geometric anomaly as the defect, because the metal layer is thin enough. Most of the laser light is reflected at K point. The scattering beam goes along KR. A part of the rest is reflected at M point. The scattered beams KR and MI are again reflected at some portions of the integral sphere and reach the photomultiplier. Thus, the existence of the defect is also be detected by the apparatus. Therefore, the laser scanning surface defect detection apparatus which is inherently directed to examining Si wafers can now be diverted to the examination of defects and dust on diamond surfaces by coating the object diamond with a thin opaque layer.

Diamond films are now examined by the laser scanning surface defect detection apparatus. The Inventors discovered that the critical density is 300 particles/cm² of the surface defect for diamond films by the examinations. Diamond films which have more than 300 particles/cm² defects shall be rejected for the substrate of SAW devices. The diamond films with defect density less than 300 particles/cm² shall be adopted as a substrate for SAW devices. The most important factor is the surface defect density for estimating diamond films as the substrate of SAW devices.

The surface roughness Ra of diamond films has an influence upon the quality of the SAW devices in addition to surface defects. The surface should have a surface roughness lower than Ra 20 nm. In particular, less than Ra 10 nm is preferable for the substrates of SAW devices. The roughness is the second criterion for estimating the quality of diamond films.

Another factor is the size of a diamond-coating wafer. Raising productivity requires a wafer size of more than 2 inches of diameter. Namely, the surface area should be wider than 19 cm² in the case of a circular wafer.

Inner stress is a further factor for defining a desirable diamond-coated wafer. If a wafer has a big inner stress, the mother materials, silicon or a metal, will be distorted. Distortion of the mother substrate deforms or bends the diamond film either in a convex or in a concave. The deformation of the diamond film reflects the laser light unevenly. A slight slanting of the wafer forbids the reflected light from going out through the outlet U and forces a part of the reflected light into the photomultiplier. Thus, inner stress should be weaker than $1.5 \times 10^8$ Pa (150 MPa=1500 bar). Besides, the distortion which is defined as the height of the center from the surface containing the periphery should be smaller than $\pm 40$ μm.

Of course, a pure diamond film is most suitable. But a diamond coated with thin carbon is also allowable, since the diamond is directed for a substrate of SAW devices. In the case, the carbon overcoat layer should be less than 10 nm in thickness. FIG. 1 shows the following requirements for the diamond film for SAW devices in the present invention.

(1) defect density $\leq 300/cm^2$
(2) surface roughness $\leq$ Ra 10 nm
(3) area $\geq 19$ cm²
(4) inner stress $\leq 150$ MPa
(5) carbon overcoating $\leq 10$ nm.

Instead of a film, a freestanding, homogeneous diamond substrate without foreign material substrate is also available. In the full diamond substrate, the thickness of the diamond crystal should be 100 μm to 2000 μm. The complete diamond substrate makes excellent SAW devices.

Complex substrates having a foreign material, e.g. silicon, substrate and a diamond film coating the substrate are, in general, made use for the substrate of SAW devices. The mother foreign material should have a thickness between 0 μm and 2000 μm. At the limit of 0 μm, the case coincides with the former full homogenous diamond substrate. The thickness of the diamond film should be more than 1 μm. The mother substrate and the diamond film should have a roughness less than Ra 20 nm. In particular, the surface roughness of the diamond film preferably is less than Ra10 nm.

(6) in the case of a homogeneous full diamond substrate, the thickness should be 100 μm to 2000 μm.
(7) in the case of a diamond/mother complex substrate, the mother substrate thickness should be 0 μm to 2000 μm.
(8) in the case of a diamond/mother complex substrate, the diamond film thickness should be more than 1 μm.
(9) the surface roughness of the diamond film or substrate should be less than Ra20 nm.

Although many proposals have been discussed and proved that diamond SAW devices would be superior in the SAW velocity to other materials, diamond SAW devices are suffering from extremely low yield due to the large propagation loss of the SAW devices having piezoelectric films upon diamonds. The low yield resulted from the lack of the method of a preliminary examination of diamond crystals. Since the property of diamond films could not be measured, SAW devices made on the property-unknown diamond crystals were tested, which lowered the yield and raised the production cost. This invention provides an estimation method which can examine diamond films or bulks at a preparatory step of making diamond SAW devices. This invention makes the best use of the laser scanning surface defect detection apparatus which prevails in silicon semiconductor industries. The laser scanning surface defect detection apparatus cannot be employed for examining diamond surfaces as it is. Preparatory coating of thin films of a metal or another opaque material enables the laser scanning surface defect detection apparatus to examine the defects of diamond surfaces. The examination reveals the density of defects and dust on diamond films or bulks for determining whether piezoelectric films and electrodes should be made upon the diamond samples at a preliminary step. Diamond crystals having defect & dust density of more than 300 particles $cm^{-2}$ cannot form good piezoelectric films and good interdigital transducers thereupon. Higher defect density than 300 particles $cm^{-2}$ lowers the yield by inviting electrode breaking or other default. Diamond surfaces of a defect density lower than 300 particles $cm^{-2}$ pass the examination. The passed diamond enables manufactures to produce low loss SAW filters available for high frequency by depositing piezoelectric films and making interdigital transducers on the diamond surfaces.

BRIEF DESCRIPTION OF THE DRAWINGS

FIG. 1 is a schematic front view of a diamond crystal having the conditions suitable for a substrate of SAW devices.

FIG. 2 is a section of a sample of a diamond crystal coated with a metal film available for an examination by a laser scanning surface defect detection apparatus.

FIG. 3(a) is a view of a defect on a diamond surface without coating, where a laser beam penetrates a transparent diamond crystal.

FIG. 3(b) is a view of a defect on a diamond surface coated with a metal film, where a laser beam can detect the defect by being reflected at the metal surface.

DETAILED DESCRIPTION OF THE PREFERRED EMBODIMENTS

Figure 4:
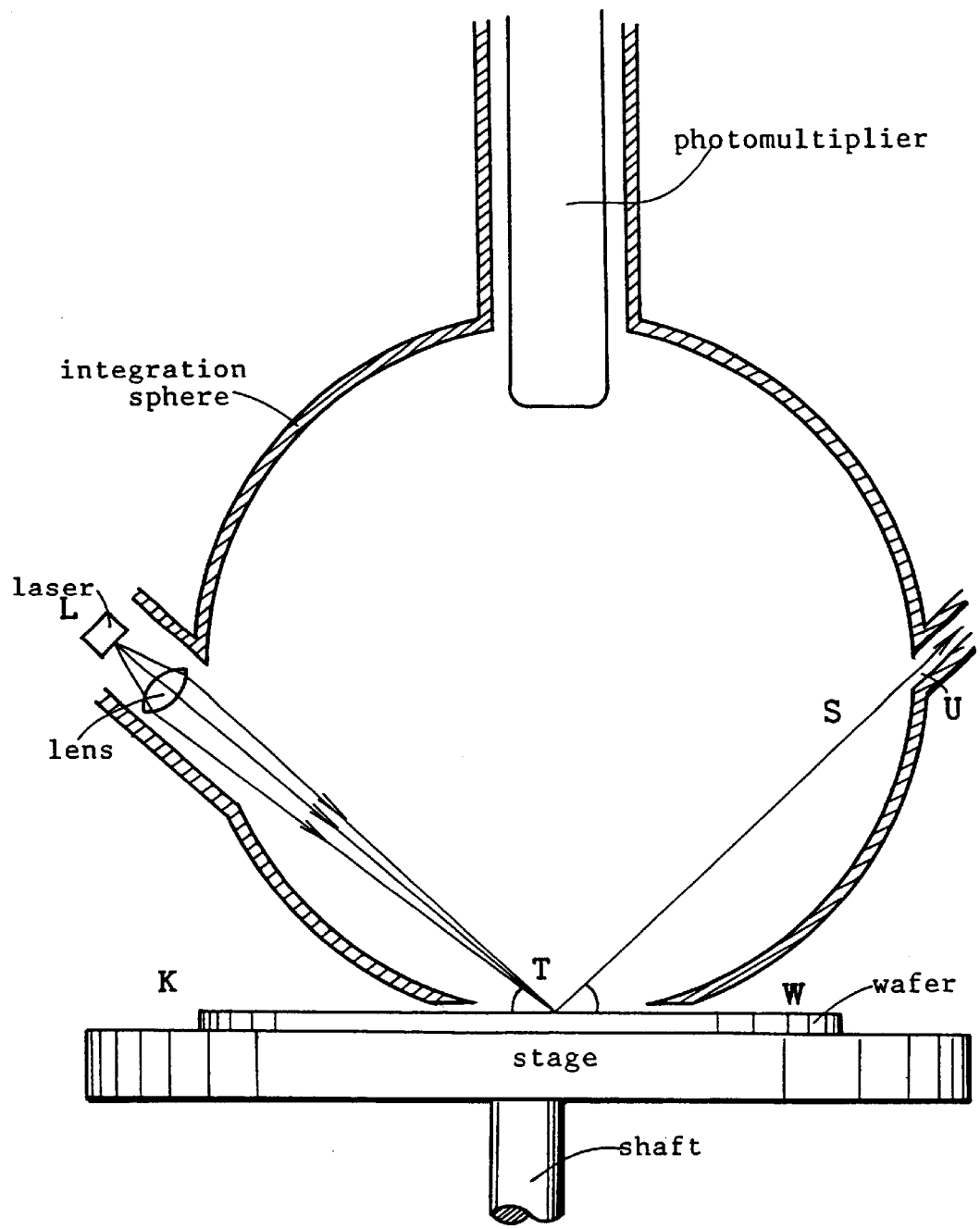
FIG. 4 is a sectional view of a laser scanning surface defect detection apparatus which has been used for examining surfaces of silicon wafers.

Diamond can be synthesized by two methods. One way produces a diamond bulk crystal from carbon at a high temperature under ultrahigh pressure. This bulk-production method is called an ultrahigh pressure synthesis. The other way produces a diamond thin film on a mother substrate by supplying hydrogen gas, hydrocarbon gas to the mother substrate, exciting the gas by heat, light or microwave, inducing a chemical reaction of the gas and depositing the reaction product on the mother substrate at a high temperature under reduced pressure. This film-production method is called a vapor phase synthesis. Both methods can produce both diamond single crystals and diamond polycrystals. This invention can be applied both to single crystals and polycrystals of diamond.

However, the ultrahigh pressure method can make only a small-sized diamond crystal. A big diamond wafer of an area wider than 19cm$^2$ (2 inches in diameter) can be produced only by the vapor phase synthesis. In any cases, synthesized diamond crystals have some surface roughness which forbids making a uniform piezoelectric film on the diamond. Then, the diamond film should be polished mechanically or chemically.

This invention makes a diamond crystal shown in FIG. 2 by synthesizing a diamond crystal from materials by the methods, polishing the synthesized diamond crystal and coating the polished diamond with a thin metal film of a thickness less than 100 nm. The diamond crystal is then examined by the laser scanning defect detection apparatus shown in FIG. 4. The metal thin film reflects the laser beams at point (T) to the outlet (U), if no defect exists at point (T). Hereafter the word "defects" broadly include intrinsic, crystallographical defects, hillocks, protrusions, concavities and dust particles on a crystal surface in the description. Geometric defects of the diamond are transcribed to the metal surface as shown in FIG. 3(b). If a defect (a dust particle or an intrinsic defect) lies on the interface between the metal and the diamond, the laser beams are scattered to some spots of the integration sphere and are reflected again to the photomultiplier. The photomultiplier senses the defects (dust particles or inherent defects) at point (T) by an increase of the photocurrent. Scanning the integration sphere on the wafer reveals the two-dimensional distribution of the defects including inherent defects and particles. 300 particles/cm$^2$ is the critical value for defect density. Diamond wafers having a defect density of more than 300 particles/cm$^2$ should be rejected. Diamond wafers of a defect density less than 300 particles/cm$^2$ pass the examination. A diamond substrate with a thin carbon coating of less than 10 nm is permitted for a diamond substrate for producing SAW devices. Preferable roughness of the coating carbon is less than Ra10 nm. But less than Ra 20nm is allowable for the surface roughness of the carbon coating.

Preferably the diamond film should be wider than 2 inches in diameter (19cm$^2$) for the standpoint of the economy of wafer processes. However, SAW devices can be fabricated on a diamond wafer less than 19 cm$^2$ as long as the wafer satisfies the other requirements.

The method of fabricating a SAW device is explained by referring to FIG. 5 to FIG. 9. A homogenous diamond bulk crystal made by the ultrahigh pressure synthesis can be a starting substrate. However, this example adopts a diamond/mother complex substrate made by the vapor phase synthesis method. This example shows a substrate consisting of a silicon (Si) mother wafer and a diamond film deposited on the silicon wafer by the microwave plasma CVD method. Si single crystal wafer is the most popular mother board. Of course, the Si wafer in FIG. 5 can be replaced by a wafer of molybdenum (Mo), nickel (Ni), aluminum nitride (AlN), alumina ($Al_2O_3$), gallium arsenide (GaAs) or so. A wafer having a diameter more than two inches (19cm$^2$) is desirable for the viewpoint of production efficiency.

Figure 6:
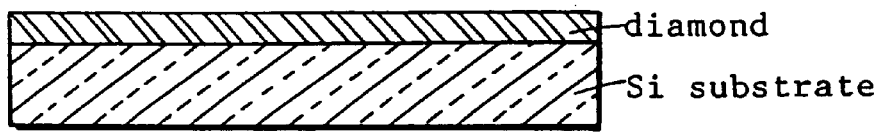
FIG. 6 is a sectional view of a Si substrate and a diamond film polished by a diamond electrodeposited whetstone.

The synthesized diamond film has a rugged surface having a plenty of concavities and convexities. Then, the diamond surface is whetted by a diamond-electrodeposited whetstone which is produced by electrodepositing diamond powder on a turntable. FIG. 6 shows a dia/Si complex wafer polished and flattened by the diamond-electrodeposited whetstone. The surface roughness should be less than Ra20 nm. Preferably the surface should be further flattened to a smoothness less than Ra 10 nm. The flattened (dia/Si) wafer is now temporarily coated by evaporation with a thin metal, e.g., aluminum film as shown in FIG. 2 or FIG. 3(b) and examined by the laser scanning surface defect detection apparatus of FIG. 4 for searching the defect density. The test clarifies the surface roughness ($\leq$Ra2 nm), the defect density ($\leq$300 particles cm$^{-2}$) and the carbon coating thickness ($\leq$10 nm) of the object dia/Si wafers. Wafers failing the test should be rejected.

Figure 7:
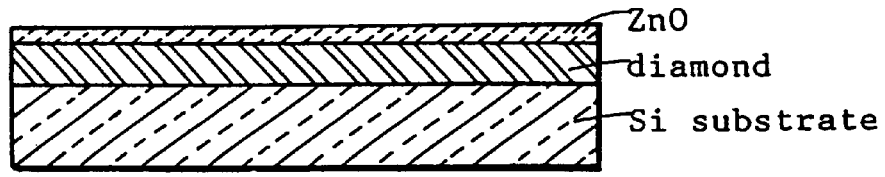
FIG. 7 is a sectional view of a sample having a piezoelectric ZnO film deposited on the diamond/Si substrate.
Figure 8:
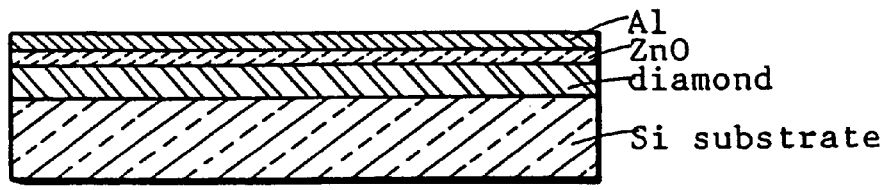
FIG. 8 is a sectional view of a sample having an aluminum film coating on the ZnO/diamond/Si substrate.
Figure 9:
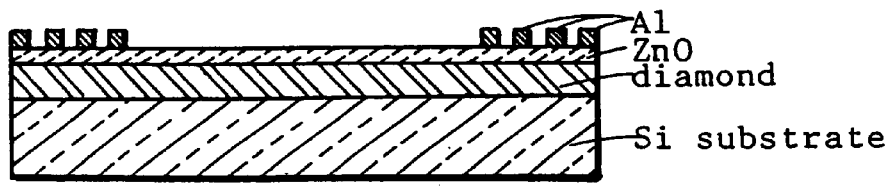
FIG. 9 is a sectional view of a sample having interdigital transducers made by selective etching of the aluminum film by lithography.
Figure 15:
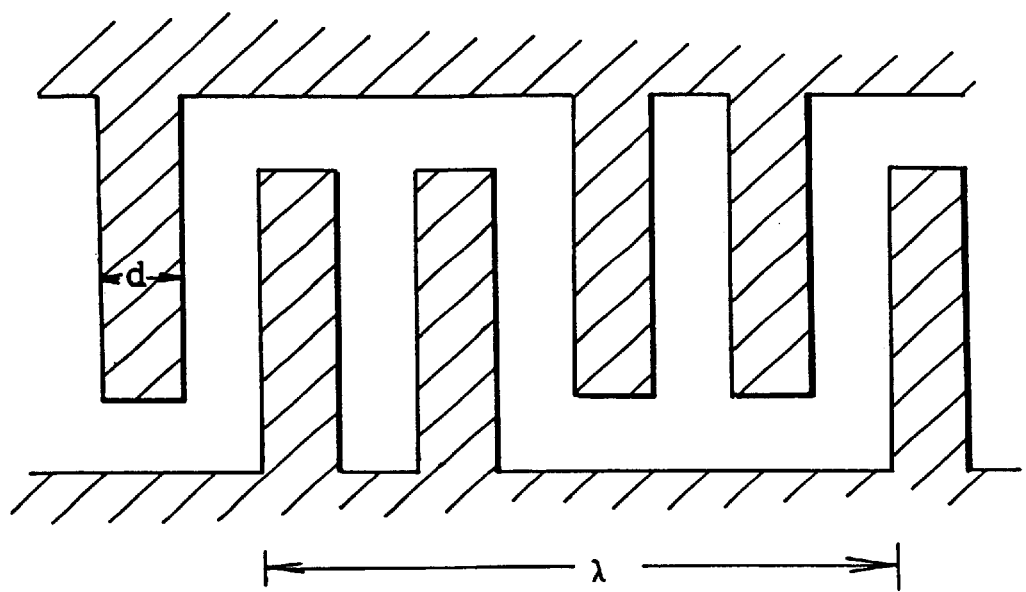
FIG. 15 is a plan view of a part of an example of an interdigital transducer.

Dia/Si wafers which passed the test are employed as substrates of SAW devices. The metal thin film is removed from the wafer. A piezoelectric film is deposited upon the wafer, for example, by sputtering. FIG. 7 shows a zinc oxide (ZnO) film for the piezoelectric film. Other piezoelectric materials, e.g., PZT, LiNbO$_3$ and LiTaO$_3$ are also available. A metal film, e.g., Al film is further formed on the piezoelectric film by sputtering or evaporation. FIG. 8 shows the Al/ZnO/dia/Si wafer. Photolithography produces interdigital transducers on both sides on a SAW chip by masking the metal film with a resist and etching of the metal by an etchant. FIG. 9 shows the interdigital transducers formed on the wafer by photolithography. There are various types of interdigital transducers. FIG. 15 denotes an example of an interdigital transducer which consists of two branches having two reciprocally facing parallel stripes in a wavelength $\lambda$..

Embodiment 1
Defect Density and Electrode Breaking Rate

A SAW device is fabricated by a series of steps of growing a diamond film on a mother material substrate, polishing the diamond film, depositing a piezoelectric film, evaporating a metal film on the piezoelectric film and etching the metal film through a mask. However, the estimation of the diamond should be finished before the formation of the piezoelectric film. Thus the electrode breaking rate should be measured by forming interdigital transducers directly on the diamond film without depositing the piezoelectric film and counting the spots of breaking electrode patterns. If the diamond has a poor quality, the interdigital transducers would break at many spots. The factor affecting the electrode breaking rate has been sought by forming an interdigital transducer directly upon the diamond, measuring the defect density and considering the correlation between the breaking rate and the diamond film.

1. Growth of Diamond Films

A 35 μm thick diamond film is grown on the silicon wafer of a 1 mm thickness by supplying hydrogen gas containing methane gas of 2vol % and exciting the mixture gas by the microwave plasma CVD method. 100 samples are produced by growing 100 diamond films on 100 Si Wafers along the same way. The surface roughnesses of the as-grown diamond wafers are, in general, more than Ra1 μm.

(Condition of Growing Diamond Films)

| Substrate | silicon wafers: thickness 1 mm |
|---|---|
| Microwave power | 150 W |
| Material gas | methane + hydrogen   $CH_4:H_{12} = 2:100$ flux 50 sccm |
| Gas pressure | 40 mTorr |
| Temperature (substrate temperature) | 800° C. |
| Thickness | 35 μm |

Figure 5:
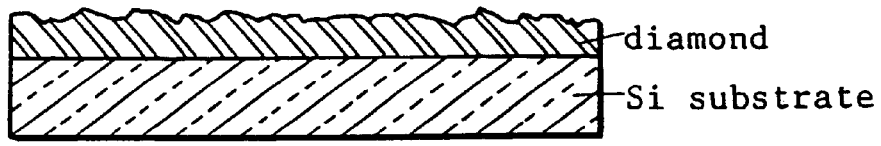
FIG. 5 is a sectional view of a Si substrate and a diamond film deposited on the Si substrate by a microwave plasma CVD (chemical vapor deposition) method.

The microwave CVD made dia/Si complex wafers as shown in FIG. 5. The 100 samples were polished by a polishing machine having a diamond whetstone. The polishing brought about even dia/Si wafers having good smoothness of less than Ra2 nm and few defects of less than 50 particles cm$^{-2}$ defects which were bigger than 0.5 μm in diameter as shown in FIG. 6. The average thickness of the Diamond Films was 20 μm. The X-ray diffraction pattern was examined by the X-ray diffraction apparatus. The diffraction pattern revealed an existence of a carbon layer on the diamond film. The thickness of the carbon layer was less than 10 nm.

2. Deposition of a Piezoelectric Film

Preliminarily 30 nm thick aluminum (Al) films were deposited upon the diamond films of the dia/Si samples by the DC sputtering method. The aluminum film coating enables the laser scanning surface defect detection apparatus to examine the surface defects on the diamonds.

(Condition for Deposition of Aluminum Films)

| Aluminum film thickness | 30 nm |
|---|---|
| DC sputtering power | 1.0 kW |
| Reaction gas | argon gas 50 sccm |
| Gas pressure | 1.0 Pa (7.6 mTorr) |
| Substrate temperature | room temperature |

Since the Al films cover the dia/Si samples, the laser scanning surface defect detection apparatus can detect defects or dust on the Diamond Films. This apparatus shoots slantingly the Al-coating diamond film with laser beams, and measures the power of the light scattered from the defects or dust by the photomultiplier(or photomulti-tube). A defect is an inherent anomaly but dust is a foreign material lying on the diamond. If the diamond is smooth and flat with little defects, the scattering light power is weak. If the diamond is rugged with many defects, the scattering light power is strong. The defect density at the object point is known by the photocurrent. As shown in FIG. 4, since the wafer is moved in parallel or in spiral, the existence of defects or dust is examined at all points on the wafer. In the measurement, the bias voltage of the photomultiplier is 550V.

The relation between the size of defect and the scattered light power is preliminarily determined by the steps of coating a wafer with standard Latex granules of a definite diameter, measuring the power of the light scattered at the granule, replacing the Latex granules with Latex granules of another diameter, measuring the power scattered by the Latex granule again and searching the relation between the granule sizes of Latex and the photocurrent.

Here, the purpose is to form interdigital transducers (IDTs) of a 1 μm line width. The Inventors think that defects with a small size less than half of the width have little influence on the electrode formation. But defects with a large size more than half of the width decrease the yield of IDTs. The Inventors considered that the critical size (d) of defects should be determined as a half (W/2) of the width (W) of interdigital transducers. For the formation of the electrodes of a 1 μm width, it is important to know the number of the defects larger than 0.5 ρm. However without microscope observation, the sizes of individual defects cannot be measured. Thus the defect was identified by employing Latex standard granules of a 0.5 μm diameter. A threshold photocurrent was determined as the current induced by a standard granule of a 0.5 μm diameter. A 0.5 μm diameter defect will cause the same increase of the scattering light power as the 0.5 μm Latex standard granule. The scattered light power is calibrated by Latex standard granules, since the size of the standard granules is uniformly deter-mined. Thus the apparatus can sense surface defects which are larger than 0.5 μm in diameter.

Besides the diameter d($\geq$W/2), the depth or height (h) of a defect is another factor affecting the electrode breaking rate. Here, the critical depth (or height) is determined to be 10 nm for a 1 μm width electrode. The defects which satisfy d$\geq$W/2 and h$\geq$10 nm should be detected and measured.

Ten samples were prepared by forming diamond films on ten silicon wafers by a similar method. Ten samples are symbolized by A, B, C, . . .,J. Ten samples were examined with regard to the surface roughness and the defect/dust number. Table 1 shows the surface roughnesses (Ra) and defect numbers of ten samples. The aluminum films were removed, when the defect measurement has once been done. The diamond surfaces appeared.

Interdigital transducers were made on the diamond layer of the dia/Si wafers. The electrode pattern breaking rates were measured. The former thin Al films aimed at measurement of defects. The present Al coating is directed to making electrodes. Both steps were, by chance, aluminum coating. But the purposes were different. The formerly coated aluminum was eliminated. A plurality of interdigital transducers were made by evaporating or sputtering aluminum on the (dia/Si) wafers, making a mask pattern by photolithography, and etching the aluminum layer. A plurality of pairs of interdigital transducers were produced on each wafer. The devices were examined by supplying currents for searching the electrode breaking. The breaking rate was calculated by dividing the number of the electrode-breaking devices by the total number of devices. The electrode breaking rate is also shown in Table 1. The breaking rate is given by an experimental equation which is called "Murphy's plot". Murphy's plot is expressed by Cexp(−DA), where C is a constant, D is the defect density and A is the area of IDT patterns. This equation means that if the area for interdigital transducers is wider, the defect density should be smaller for keeping the same yield.

It is a general agreement that if the defect size (W) is larger than a half of the minimum pattern width (d), the yield of the IDTs will decrease. For making electrodes having a width of 1 μm, the defects larger than 0.5 μm tend to plague the formation of electrodes. Here the "defects" include dust particles and inherent defects. Table 1, the third column, shows the result of measurement of the number of defects larger than 0.5 μm for (diamond wafer) samples A to I. Meandering patterns with 400 electrode stripes of a 1 μm length×500 μm width were formed in a spatial period of 1000 μm on two inch diameter diamond wafers. The line width (length) of an individual stripe is 1 μm. The distance between neighboring stripes was 1 μm. Thus, 400 stripes have a width of about 800 μm. The total area of a wafer is about 19cm$^2$=1900 mm$^2$. One spatial period is 1000 μm ×500 μm=0.5 mm$^2$. About 3800 sets of 400 electrode stripes were made on each diamond wafer. Then the electrodes were examined by supplying currents. Some electrodes turned out to be broken due to the roughness of the diamond film. The number of breaking electrodes was counted for every diamond wafer sample. The breaking rates were also listed in Table 1.

TABLE 1

Roughness Ra (nm), Defect density and Breaking rate of aluminum electrodes of samples A to J of (dia/Si)-substrates

| SAMPLE NO. | ROUGHNESS Ra (nm) | DEFECTS DENSITY (particles cm$^{-2}$) | BREAKING RATE OF Al ELECTRODES (%) |
|---|---|---|---|
| A | 7.2 | 80 | 0% |
| B | 8.2 | 287 | 0% |
| C | 7.6 | 462 | 1.2% |
| D | 8.3 | 812 | 4.8% |
| E | 8.9 | 1431 | 11.3% |
| F | 7.8 | 2436 | 33.8% |
| G | 9.8 | 3788 | 72.3% |
| H | 7.6 | 4689 | 91.8% |
| I | 8.2 | 6126 | 100% |
| J | 21.9 | Not examined | Not made |

The surface roughnesses Ra are dispersed between 7.2 nm and 21.9 nm. Sample J had too big surface roughness Ra=21.9 nm which forbade the formation of interdigital transducers. Having the same roughness Ra=7.6 nm, sample C and sample H have different breaking rates 1.2% and 91.8% respectively. This means that the surface roughness is not a critical factor for determining the breaking rate.

Sample E with Ra=8.9 nm shows a good breaking rate 11.3% which is much better than a breaking rate 100% of sample I of Ra=8.2 nm. The breaking rates are reversed to Ra for samples E and I. Sample H, suffering from a high breaking rate of 91.8%, is useless for the substrate of SAW devices. However, a person who pays attention only to Ra would consider that sample H must be a good substrate. Ra is not a reliable factor for foreseeing the quality of electrodes formed upon the sample.

Then, the breaking rates are now considered in a different standpoint. Sample B enjoys 0% of pattern breaking rate, since it has a small defect density of 287 particles/cm$^2$. Sample A exhibits 0% breaking rate due to the very small defect density of 80 particles/cm$^2$. Sample C has still a low defect density of 462 particles cm$^{-2}$ which suppresses the breaking rate to 1.2%. Sample D has a defect density of 812 particles cm$^{-2}$ which is about twice as many as sample C. The electrode breaking rate is also doubled to 4.8%. Sample F which has defects of 2436 particles cm$^{-2}$ is accompanied by a high breaking rate 33.8%. Sample G with a defect density 3788 particles cm$^{-2}$ is afflicted with a high breaking rate 72.3%. Despite low Ra=7.6 nm, sample H has a very high breaking rate 91.8% due to the large defect density of 4689 particles cm$^{-2}$. What these results tell is that the most important factor of determining the quality of electrodes is not the surface roughness Ra but the defect/dust density. Namely, the examination by the laser scanning surface defect detection apparatus gives the most suitable estimation for the surface states of diamond wafers.

An ideal condition is, of course, 0% of breaking rate. For 0% of breaking rate, the defect (and dust) density should be less than 300 particles cm$^{-2}$, because sample B of 0% has a defect density less than 300 particles cm$^{-2}$ but sample C of 1.2% has a defect density more than 300 particles cm$^{-2}$. Thus, 300 particles cm$^{-2}$ is the critical value ruling the break of electrode patterns. The roughness must be less than 20 nm. The roughness is not a major factor for determining the breaking rate. The roughness less than Ra=10 nm is more suitable for decreasing the breaking rate.

What affects the break of electrode patterns is not the surface roughness but the defect density. There has been no means for estimating defects of diamond crystals. The Inventors succeeded in examining the defect on diamond crystals by coating the object diamond with a thin metal film and measuring the scattering light in the laser scanning surface defect detection apparatuses which have been widely employed for estimation of silicon wafers. The new estimation method using the laser scanning surface defect detection apparatus can give a definite requirement of diamond films or bulks suitable for the substrates of SAW devices. The preliminary estimation can prophesy that the object diamond crystals are appropriate for the substrates for making piezoelectric films and producing interdigital transducers. SAW devices should be made only on the diamond substrates which passed the examination. The samples which fail in the examination should be rejected without making piezoelectric films and interdigital transducers (IDT). The estimation can save much time, energy and resources.

Embodiment 2
Measurement of Propagation Loss On Samples Having Piezoelectric Films The previous test tells us that sample A and sample B of less than 300 defects/cm$^2$ are immune from electrode breaking. However the defect estimation is not sufficient to know the performance of SAW devices which are going to be made by depositing piezoelectric films and electrodes on the diamond substrates. Then, actual propagation loss was measured on SAW devices made by depositing piezoelectric films on the dia/Si wafers of sample A and sample B which passed the defect test and forming interdigital transducers on the piezoelectric films. No SAW devices were made on samples C to J which failed in the defect test.

1. Formation of Piezoelectric Films

Piezoelectric ZnO films of a 1050 nm thickness were formed upon the dia/Si substrates of sample A and sample B by an RF sputtering method.

(Condition of Formation of ZnO Piezoelectric Film)

| | |
|---|---|
| Substrates | dia/Si wafers: sample A, sample B |
| Target | ZnO sintered plate |
| RF power | 500 W (13.56 MHz) |
| Reaction gas | Ar + O$_2$    Ar:O$_2$ = 1:1 |

-continued

| | |
|---|---|
| | gas flow 50 sccm |
| Gas pressure | 20.0 Pa (152 mTorr) |
| Substrate temperature | 150° C. |
| Speed of deposition | 5 nm/min |
| Thickness | 1050 nm (1.05 μm) |

Complex wafers of ZnO/dia/Si were made from samples A and B by the above way.

2. Formation of Aluminum Films 80 nm thick aluminum films were deposited upon the ZnO films for making electrodes by a DC sputtering method.
(Condition of forming aluminum films)

| | |
|---|---|
| DC sputtering power | 1.0 kW |
| Reaction gas | Ar gas |
| | gas flow 50 sccm |
| Gas pressure | 1.0 Pa (7.6 mTorr) |
| Substrate temperature | room temperature |
| Thickness | 80 nm |

This step made further complex wafers of Al/ZnO/dia/Si.

3. Production of Interdigital Transducers

Interdigital transducers having the following parameters were formed by eliminating parts of the aluminum layer selectively by photolithography.
(Parameters of Interdigital Transducers)

| | |
|---|---|
| Line Width of IDTs | 0.8 μm (central frequency = 1.75 GHz) |
| Number of stripes | 40 pairs double stripes (regular type) |
| Aperture of IDTs | 50 × wavelength |
| | (wavelength = 8 stripe widths λ = 6.4 μm) |
| Distance between the centers of input- and output- transducers | 50 × wavelength |

FIG. 15 shows the IDT pattern. A unit pattern consists of two sets of stripe pairs. Two neighboring stripes belong to the same transducer. Four stripes construct one wavelength. The width of a blank is equal to the width of a stripe. The wavelength is eight times as long as the stripe width (λ=8d). Thus, SAW devices shown in FIG. 9 have been fabricated.

Transmission loss and the conversion loss of the SAW devices were measured by a spectrum network analyzer (HP8753c). AC power of 1 GHz to 2 GHz was applied to one side electrode (electrode 1). The electric power of the input electrode 1 and the electric power of the output (counterpart) electrode 2, that is, scattering parameters were measured. S11 is a reflection power ratio which is a quotient of the reflected power to the electrode 1 to the input power of the electrode 1, when the AC power is supplied to the electrode 1. S22 is a reflection power ratio which is a quotient of the reflected power to the electrode 2 to the input power to the electrode 2, when AC power is supplied to the electrode 2. S12 is a transmission power ratio which is a quotient of the power arrived at the electrode 2 to the input power to the electrode 1, when AC power is supplied to the electrode 1. S21 is a transmission power ratio which is a quotient of the power arrived at the electrode 1 to the input power to the electrode 2, when AC power is supplied to the electrode 2.

Figure 10:
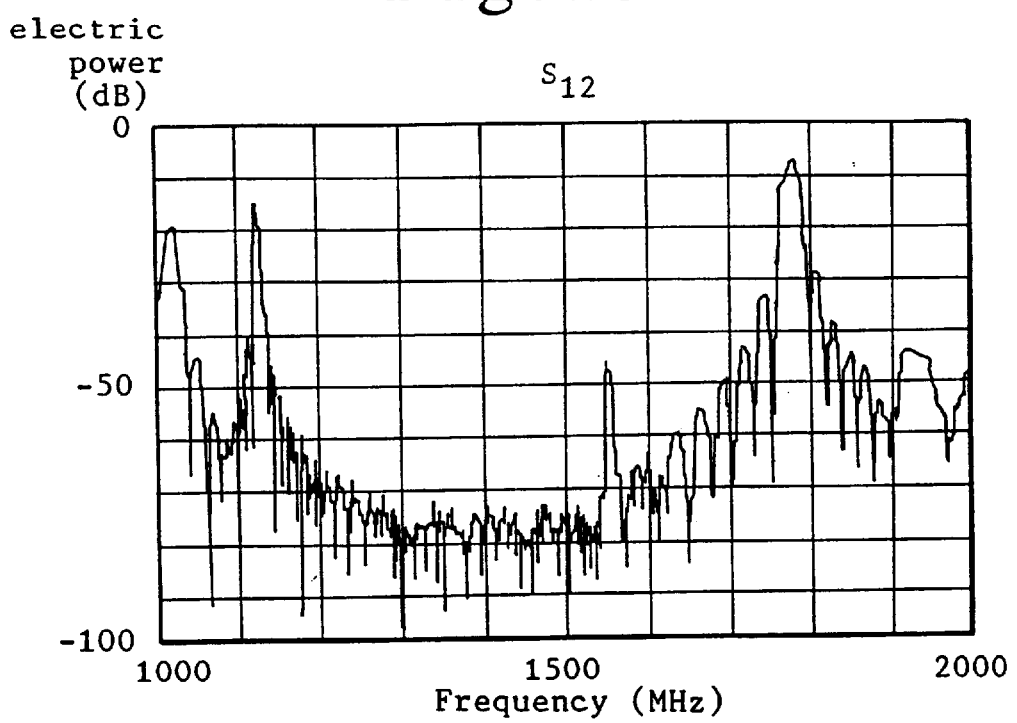
FIG. 10 is a graph of the frequency dependence of S12 of an embodiment SAW filter of the present invention. The abscissa is the frequency (MHz) and the ordinate is the electric power ratio (dB).

FIG. 10 shows the transmission power ratio (S12) as a signals. The abscissa is the frequency (MHz). The ordinate is the transmission power ratio (dB). 1.78 GHz (1780 MHz) gives a peak of the transmission power of −8.2 dB. The frequency corresponds to $f=v/\lambda$, where v is the speed of the SAW and $\lambda$ is the spatial wavelength of the interdigital transducer which is a predetermined parameter, as shown in FIG. 15. It is a matter of course that the transmission power ratio is the biggest at 1.78 GHz=$v/\lambda$. The maximum transmission power ratio is −0.82 dB. The loss 8.2 dB includes all the resistance loss at electrodes, the bilateral loss and the conversion loss. The real transmission loss can be calculated by subtracting these losses from the total loss 8.2 dB.

Figure 11:
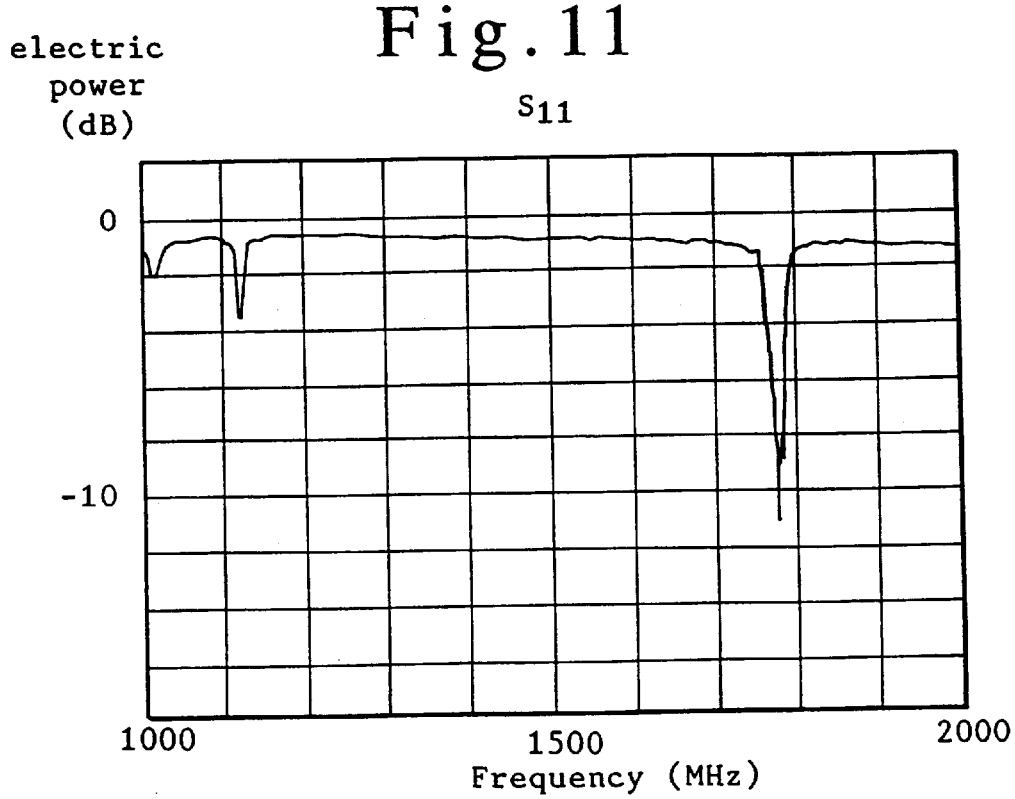
FIG. 11 is a graph of the frequency dependence of S11 of the same SAW filter. The abscissa is the frequency (MHZ) and the ordinate is the electric power ratio (dB).
Figure 12:
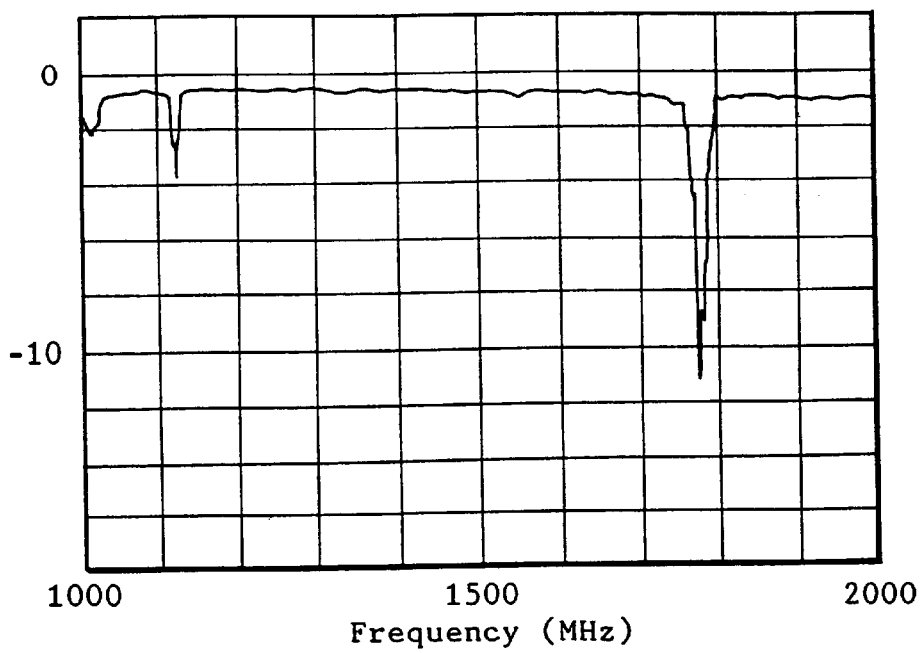
FIG. 12 is a graph of the frequency dependence of S22 of the same SAW filter. The abscissa is the frequency (MHZ) and the ordinate is the electric power ratio (dB).
Figure 13:
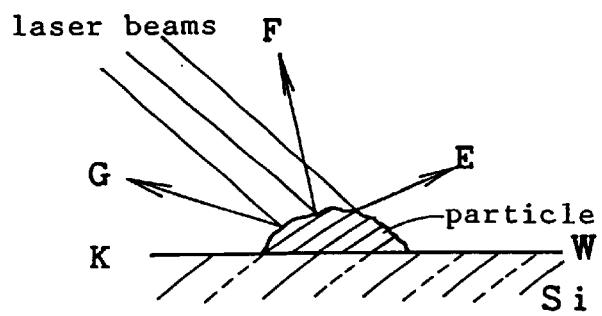
FIG. 13 is a section of a particle of dust lying on the diamond surface which scatters laser beams in random directions.
Figure 14:
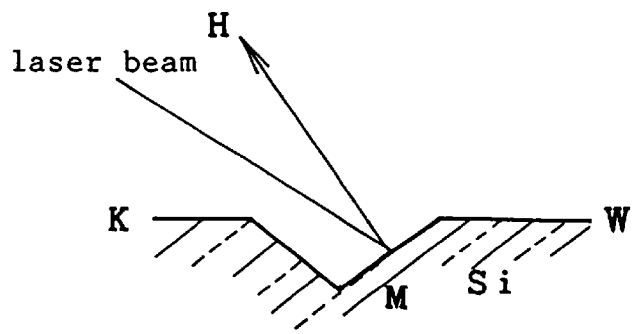
FIG. 14 is a section of a defect which scatters a laser beam.

The resistance loss is calculated to be 1.0 dB for an electrode stripe of a 80 nm thickness and a 0.8 μm width. The bilateral loss is 6 db, because the power is halved at the input electrode. FIG. 11 shows S11 and FIG. 12 shows S22. The conversion loss is known from the loss of the flat regions of S11 or S22 except f=78 GHz. The loss is about 0.3 dB both for S11 and for S22. The conversion loss occurs at both the input and the output electrodes. Then, the conversion loss is 0.6 dB at both electrodes. The sum of the resistance loss, the bilateral loss and the conversion loss is 7.6 dB. The total loss for 1.78 GHz is 8.2 dB from S12. The propagation loss is only 0.6 dB which is a difference between the total loss 8.2 dB and the sum 7.6 dB of the three losses. 0.6 dB is a small propagation loss.

This is the total propagation loss along the whole path from the input electrode to the output electrode. The distance between the centers of the electrodes is 50 times as long as the wavelength. The propagation loss per wavelength is 0.012 dB which is calculated by dividing 0.6 dB by 50λ. The propagation loss 0.012dB/λ is a very small value for such a high frequency 1.8 GHz. The low propagation loss is a very conspicuous advantage of the SAW devices of the present invention. Table 1 shows that sample A and sample B are free from electrode breaking. Sample A has a surface defect density of 80 particles $cm^{-2}$ which is far lower than the critical value 300 particles $cm^{-2}$. The surface roughness of sample A is Ra7.2 nm. Sample B has a higher defect density of 287 particles $cm^{-2}$ which is still lower than 300 particles $cm^{-2}$. Sample B exhibits the roughness of Ra8.2 nm. Both sample A and sample B are endowed with low insertion loss of about 10 dB.

Other samples C to I have definite electrode breaking rates and low yields for producing SAW devices. SAW devices have been fabricated on samples C to I in a similar manner. The electrodes of the SAW devices are examined by electric property measurement, optical microscope observation and electron microscope observation. Some SAW devices are suffering from electrode breaking. Others are immune from electrode breaking. The properties of SAW devices without electrode breaking are tested. All the samples of C to I have insertion loss higher than 13 dB. This examination reveals bad crystallographic properties of the piezoelectric films of samples C to I. The surface defects of diamond films worsen the crystallographic properties of the piezoelectric films. The bad crystallography of piezoelectric films raises the propagation loss of the SAW devices made on samples C to I.

This invention examines surface defects of diamond films or bulks by covering the object diamond surfaces with thin metal films and measuring defects by the laser scanning surface defect detection apparatus. The preliminary examination can foresee the properties of SAW devices which will be made on the diamond crystals. SAW devices should be fabricated only upon the samples having diamond surface of small defect density, for example, less than 300 particles $cm^{-2}$. Here, the definition of a defect includes the critical size which depends upon the period of the electrodes. Thus, the defect density of the same diamond is different for different periods of the electrodes of SAW devices. Low defect density diamond films or bulks bring about zero or small enough electrode breaking rates when electrodes are made thereon. Low propagation loss SAW devices can be produced by depositing piezoelectric films on the low defect density diamonds and making interdigital transducers on the piezoelectric films.

What we claim is:

1. A diamond surface acoustic wave device comprising;

a bulk diamond single crystal or polycrystal substrate being synthesized by an ultrahigh pressure synthesis method or a vapor phase deposition method and having surface defect density of less than 300 particles $cm^{-2}$ or a diamond substrate consisting of a diamond board or another material board and a single crystal or polycrystal diamond film being synthesized upon the diamond board or another material board and having surface defect density of less than 300 particles $cm^{-2}$;

the defect density being defined by $d \geq W/2$ and $h \geq 10$ nm, where d is a diameter of a defect, W is the minimum width of electrodes and h is a depth or a height of the defect;

a piezoelectric film deposited on the diamond substrate; and interdigital transducers produced on the piezoelectric film;

wherein the defect density is measured by coating the diamond surface with a thin opaque film, launching laser beams to the coated diamond surface from a laser scanning surface defect detection apparatus for letting the laser beams reflect at a surface of the coating film and an interface between the coating film and the diamond surface, and counting the beams scattered by surface defects or particles on the diamond surface.

2. A diamond surface acoustic wave device comprising;

a bulk diamond single crystal or polycrystal substrate being synthesized by an ultrahigh pressure synthesis method or a vapor phase deposition method and having surface defect density of less than 300 particles $cm^{-2}$ or a diamond substrate consisting of a diamond board or another material board and a single crystal or polycrystal diamond film being synthesized upon the diamond board or another material board and having surface defect density of less than 300 particles $cm^{-2}$;

the defect density being defined by $d \geq W/2$ and $h \geq 10$ nm, where d is a diameter of a defect, W is the minimum width of electrodes and h is a depth or a height of the defect;

interdigital transducers produced on the diamond substrate; and a piezoelectric film deposited on the interdigital transducers and on the diamond substrate;

wherein the defect density is measured by coating the diamond surface with a thin opaque film, launching laser beams to the coated diamond surface from a laser scanning surface defect detection apparatus for letting the laser beams reflect at a surface of the coating film and an interface between the coating film and the diamond surface, and counting the beams scattered by surface defects or particles on the diamond surface.

* * * * *